United States Patent
Heid et al.

(10) Patent No.: US 9,466,867 B2
(45) Date of Patent: Oct. 11, 2016

(54) DEVICE FOR COUPLING RF POWER INTO A WAVEGUIDE

(71) Applicant: SIEMENS AKTIENGESELLSCHAFT, München (DE)

(72) Inventors: Oliver Heid, Erlangen (DE); Timothy Hughes, Wantage (GB)

(73) Assignee: SIEMENS AKTIENGESELLSCHAFT (DE)

( * ) Notice: Subject to any disclaimer, the term of this patent is extended or adjusted under 35 U.S.C. 154(b) by 9 days.

(21) Appl. No.: 14/430,318

(22) PCT Filed: Sep. 26, 2012

(86) PCT No.: PCT/EP2012/068922
§ 371 (c)(1),
(2) Date: Mar. 23, 2015

(87) PCT Pub. No.: WO2014/048458
PCT Pub. Date: Apr. 3, 2014

(65) Prior Publication Data
US 2015/0255848 A1    Sep. 10, 2015

(51) Int. Cl.
| | | |
|---|---|---|
| *H01P 5/00* | (2006.01) | |
| *H01P 1/207* | (2006.01) | |
| *H01P 1/212* | (2006.01) | |
| *H01P 3/12* | (2006.01) | |
| *H01P 5/08* | (2006.01) | |
| *H03F 3/45* | (2006.01) | |

(52) U.S. Cl.
CPC .................. *H01P 5/00* (2013.01); *H01P 1/207* (2013.01); *H01P 1/212* (2013.01); *H01P 3/12* (2013.01); *H01P 5/08* (2013.01); *H01P 5/082* (2013.01); *H03F 3/45183* (2013.01); *H03F 2203/45481* (2013.01)

(58) Field of Classification Search
CPC .......... H01P 5/00; H01P 1/207; H01P 1/212; H01P 3/12; H01P 5/08; H01P 5/082
USPC ......................................... 333/208, 239, 248
See application file for complete search history.

(56) References Cited

U.S. PATENT DOCUMENTS

| | | |
|---|---|---|
| 3,109,144 A | 10/1963 | Heninger |
| 4,070,639 A | 1/1978 | Nemit |
| 4,272,740 A * | 6/1981 | MacMaster ............. H03F 3/602 330/286 |

FOREIGN PATENT DOCUMENTS

CN    101788258 A    7/2010

OTHER PUBLICATIONS

Translation of First Office Action for Chinese application No. 2012800760051, mailed on Mar. 30, 2016.
O. Heid et al.;"Compact solid state direct drive RF linac";Proc. of IPAC 10, Kyoto; 23.05.-28.05.10, pp. 4278-4280; 2010.
International Search Report for PCT Application No. PCT/EP2012/068922, mailed on Dec. 3, 2012; 6 pages.

* cited by examiner

*Primary Examiner* — Stephen E Jones
*Assistant Examiner* — Scott S Outten
(74) *Attorney, Agent, or Firm* — Schmeiser Olsen & Watts LLP

(57) ABSTRACT

A device for coupling RF power into a waveguide includes a push-pull output stage that includes an input and an output, a filter arrangement that is connected to the output of the push-pull output stage, and an induction loop that is connected to the filter arrangement is provided.

13 Claims, 3 Drawing Sheets

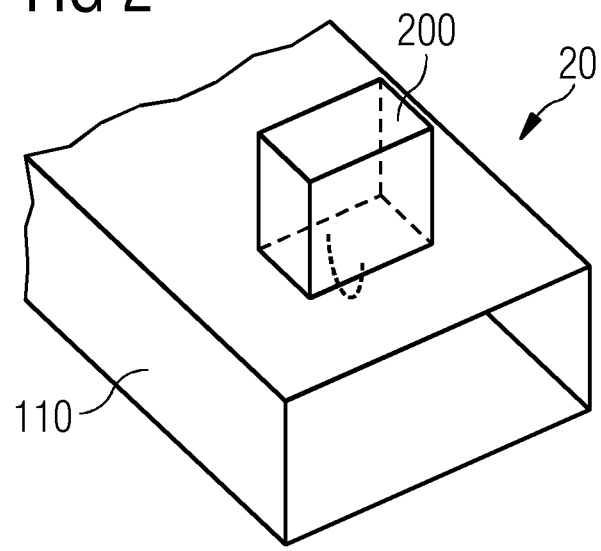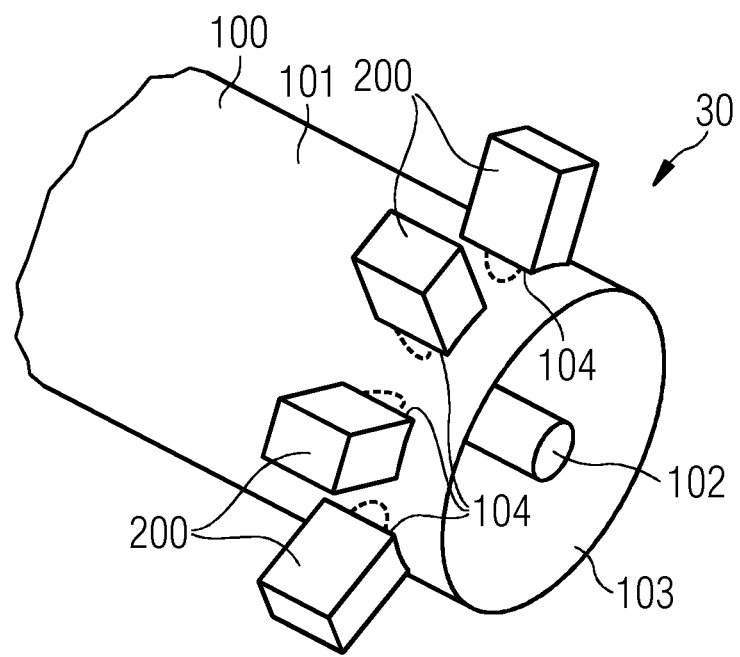

DEVICE FOR COUPLING RF POWER INTO A WAVEGUIDE

CROSS-REFERENCE TO RELATED APPLICATIONS

This application claims priority to PCT Application No. PCT/EP2012/068922 having a filing date of Sep. 26, 2012 the entire contents of which are hereby incorporated by reference.

FIELD OF TECHNOLOGY

The present following relates to a device for coupling RF power into a waveguide, and to a waveguide arrangement.

BACKGROUND

Radiofrequency cavities (radiofrequency resonators) are used, for example, in particle accelerators for accelerating electrically charged particles. In order to excite a radiofrequency electromagnetic oscillation in such an RF cavity, the RF cavity must be supplied with RF power. It is known to generate RF power, for example, by means of a tetrode or a klystron, at a first position and then deliver it via a waveguide to the RF cavity arranged at a second position. The waveguide may, for example, be connected to the RF cavity via an opening or by inductive coupling. The various injection points must be accurately matched to one another. Nevertheless, each injection point is associated with inevitable power losses.

SUMMARY

An aspect relate to an improved device for coupling RF power into a waveguide. A further aspect relates to an improved waveguide arrangement.

A device according to embodiments of the invention for coupling RF power into a waveguide comprises a push-pull output stage having an input and an output, a filter arrangement which is connected to the output of the push-pull output stage, and an induction loop which is connected to the filter arrangement. Advantageously, this device connects the push-pull output stage for generating RF power to the induction loop for coupling the RF power into a waveguide. The device thus allows generation of RF power directly at the RF power input coupling position, so that the complexity of the overall arrangement is reduced. The device is advantageously inherently modular. By using a multiplicity of such devices, it is readily possible to scale the RF power which can be generated. In this way, even very high RF powers can advantageously be achieved. The scalability achievable by parallel arrangement is furthermore advantageously associated with a direct increase in reliability. Highly efficient operation of the device is advantageously possible by virtue of the integration of the filter arrangement into the device.

In one embodiment of the device, the filter arrangement comprises a first harmonic filter and a second harmonic filter. Advantageously, the harmonic filter of the filter arrangement may have different filter characteristics for different harmonics of a fixed frequency.

In one embodiment of the device, the first harmonic filter provides a fixed finite impedance for a fundamental oscillation with a fixed frequency. The filter arrangement then advantageously leads to unvitiated coupling of the fundamental oscillation into the waveguide.

In one embodiment of the device, the first harmonic filter acts as an open line termination for a third harmonic of the fixed frequency. This advantageously allows rapid switching with a high edge steepness for the push-pull output stage, so that switching losses can advantageously be minimized.

In one embodiment of the device, the second harmonic filter acts as a short-circuited line termination for a second harmonic of the fixed frequency. The effect advantageously achieved by this is that the lowest possible voltages are applied, and the smallest possible currents flow, in the push-pull output stage during switching, so that switching losses can be minimized.

In one embodiment of the device, the filter arrangement induces a reflection factor of at least 0.8 for a third harmonic of the fixed frequency. The filter arrangement then advantageously acts approximately as an open line termination for a third harmonic of the fixed frequency.

In one embodiment of the device, the filter arrangement induces a reflection factor of less than −0.8 for a second harmonic of the fixed frequency. The filter arrangement then advantageously acts approximately as a short-circuited line termination for the second harmonic of the fixed frequency.

In one embodiment of the device, it comprises a coupling plate. The induction loop is in this case arranged on the coupling plate. Furthermore, the coupling plate is intended to be arranged in an opening of a wall of a waveguide. The induction loop can then advantageously be arranged inside the waveguide in such a way that an electromagnetic oscillation mode can be excited in the waveguide by means of the induction loop. The coupling plate then advantageously allows simple mechanical coupling of the device to the waveguide.

A waveguide arrangement according to embodiments of the invention comprises a waveguide and a device of the type mentioned above. With this waveguide arrangement, RF power can advantageously be generated by the device and coupled directly into the waveguide. The waveguide arrangement is therefore configured compactly and only has low complexity.

In one embodiment of the waveguide arrangement, it comprises two devices of the type described above. With this waveguide arrangement, the RF powers generated by means of the two devices are advantageously added, so that an overall higher RF power can be coupled into the waveguide. The provision of two RF power coupling devices also reduces any likelihood of simultaneous failure of both RF power coupling devices of the waveguide arrangement.

In one embodiment of the waveguide arrangement, the waveguide is a coaxial waveguide. The device can then advantageously be arranged in a recess of an outer conductor of the coaxial waveguide.

In another embodiment of the waveguide arrangement, the waveguide is a hollow conductor. The RF power coupling device can then advantageously be arranged at a position of the hollow conductor in order to excite a desired oscillation mode in the hollow conductor.

In one embodiment of the waveguide arrangement, the waveguide is connected to an RF cavity. The RF power generated by the device and coupled into the waveguide can then advantageously be fed into the RF cavity via the waveguide.

BRIEF DESCRIPTION Some of the embodiments will be described in detail, with reference to the following figures, wherein like designations denote like members, wherein:

FIG. 2 shows an embodiment of a waveguide arrangement having a hollow waveguide;

FIG. 3 shows an embodiment of a waveguide arrangement having a plurality of RF power coupling devices;

DETAILED DESCRIPTION

Figure 1:
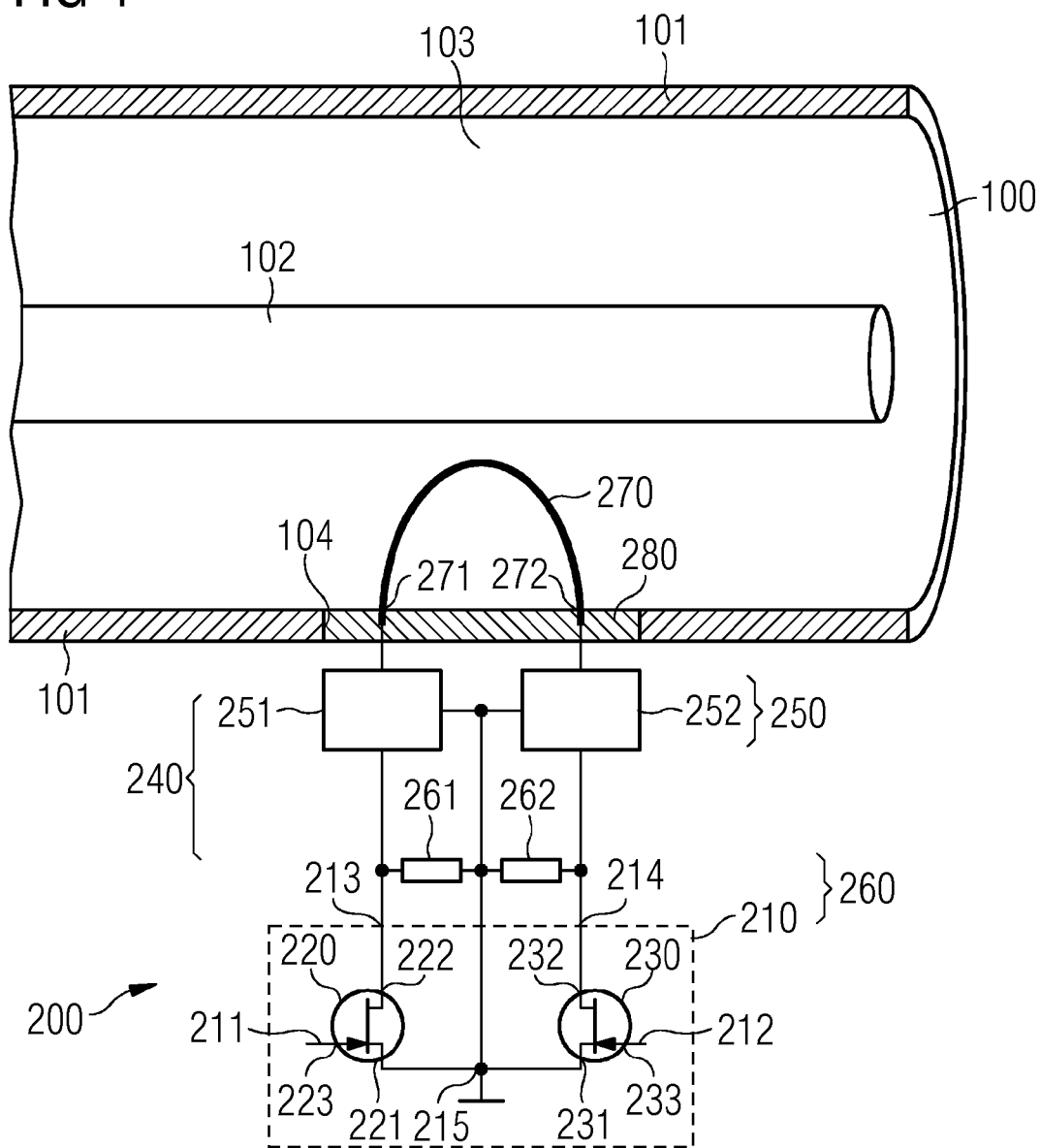
FIG. 1 shows an embodiment of a waveguide arrangement having an RF power coupling device and a coaxial waveguide.

FIG. 1 shows a waveguide arrangement 10 in a highly schematized representation. The waveguide arrangement 10 comprises a coaxial waveguide 100 and a device 200 for coupling RF power into the coaxial waveguide 100. The waveguide arrangement 10 may, for example, be used to generate RF power and feed it into an RF cavity. The RF cavity may in turn, for example, be used for accelerating charged particles in a particle accelerator.

FIG. 1 only shows a short longitudinal section of the coaxial waveguide 100. The coaxial waveguide 100 has an outer conductor 101, which is arranged coaxially with an inner conductor 102 and surrounds it concentrically. The outer conductor 101 and the inner conductor 102 each consist of an electrically conductive material. For example, the outer conductor 101 and the inner conductor 102 may comprise copper. The outer conductor preferably has a hollow cylindrical shape with a circular cross section. The inner conductor 102 preferably has a circular-cylindrical shape. A dielectric 103 is arranged between the outer conductor 101 and the inner conductor 102. The outer conductor 101 of the coaxial waveguide 100 has an opening 104.

The RF power coupling device 200 comprises a push-pull output stage 210, a filter arrangement 240 and an induction loop 270. All the components are presented merely by way of example and schematically in the figure. The push-pull output stage 210 is used to generate RF power. The filter arrangement 240 causes impedance transformation. The induction loop 207 is used for coupling the generated RF power into the coaxial waveguide 100.

The push-pull output stage 210 has a first input 211, a second input 212, a first output 213, a second output 214 and a ground contact 215. At the first input 211 and the second input 212, an e.g. sinusoidal input signal may be delivered to the push-pull output stage 210, the polarities at the first input 211 and the second input 212 being mutually opposite. The push-pull output stage 210 can output generated RF power via the first output 213 and the second output 214.

In the schematic example represented, the push-pull output stage 210 has a first transistor 220 and a second transistor 230. Of course, the push-pull output stage 210 could, however, also comprise further components. The first transistor 220 is formed as an n-channel depletion layer field-effect transistor and has a source contact 221, a drain contact 222 and a gate contact 223. The second transistor 230 is likewise formed as an n-channel depletion layer field-effect transistor and has a source contact 231, a drain contact 232 and a gate contact 233. The source contact 221 of the first transistor 220 and the source contact 231 of the second transistor 230 are connected to the ground contact 215. The gate contact 223 of the first transistor 320 forms the first input 211 of the push-pull output stage 210. The gate contact 233 of the second transistor 230 forms the second input 212 of the push-pull output stage 210. The drain contact 222 of the first transistor 220 forms the first output 213 of the push-pull output stage 210. The drain contact 232 of the second transistor 230 forms the second output 214 of the push-pull output stage 210.

The filter arrangement 240 comprises a first harmonic filter 250 and a second harmonic filter 260. The first harmonic filter 250 comprises a first part 251 and a second part 252. The second harmonic filter 260 comprises a first part 261 and a second part 262. The first part 251 of the first harmonic filter 250 is connected to the first output 213 of the push-pull output stage 210, the ground contact 215 and a first contact 271 of the induction loop 270. The second part 252 of the first harmonic filter 250 is connected to the second output 214 of the push-pull output stage 210, the ground contact 215 and a second contact 272 of the induction loop 270. The first part 261 of the second harmonic filter 260 is connected to the first output 213 of the push-pull output stage 210 and to the ground contact 215. The second part 262 of the second harmonic filter 260 is connected to the second output 214 of the push-pull output stage 210 and to the ground contact 215.

The first harmonic filter 250 may be constructed from discrete elements or from line sections. The first harmonic filter 250 causes impedance transformation, so that a first harmonic, or a fundamental oscillation, with a fixed frequency sees a fixed required load impedance, while a third harmonic sees an open line termination or at least an approximately open line termination. This leads to a high reflection factor for the third harmonic, which lies close to the value 1. The reflection factor is preferably at least 0.8.

The effect of the impedance transformation caused by the first harmonic filter 250 of the filter arrangement 240 is that the transistors 220, 230 of the push-pull output stage 210 can switch between open and closed states with a high edge steepness.

In this way, switching losses in the transistors 220, 230 of the push-pull output stage 210 are advantageously minimized.

Owing to the second harmonic filter 260 of the filter arrangement 240, a second harmonic of the fixed frequency sees an approximately short-circuited line termination. This leads for the second harmonic to a reflection coefficient which is close to a value of −1. The reflection factor for the second harmonic is preferably less than −0.8. The effect of the second harmonic filter 260 of the filter arrangement 240 is therefore that the voltages applied to the transistors 220, 230 of the push-pull output stage 210 during the switching times of the transistors 220, 230 have the lowest possible values, and the smallest possible currents flow during the switching times of the transistors 220, 230 of the push-pull output stage 210. In this way as well, the switching losses in the transistors 220, 230 of the push-pull output stage 210 are advantageously minimized.

The induction loop 270 is arranged on a coupling plate 280 of the RF power coupling device 200. The coupling plate 280 is arranged in the opening 104 of the outer conductor 101 of the coaxial waveguide 100 in such a way that the induction loop 200 is arranged in the region of the dielectric 103 inside the outer conductor 101 of the coaxial waveguide 100. The RF power generated by the push-pull output stage 210 can be coupled into the coaxial waveguide 100 by means of an alternating magnetic field generated by the induction loop 270. The coaxial waveguide 100 can forward this RF power in the longitudinal direction.

FIG. 2 shows a waveguide arrangement 20 according to a second embodiment in a schematic representation. Instead of the coaxial waveguide 100, a hollow waveguide 110 is provided in the waveguide arrangement 20. An RF power coupling device 200 corresponding to the description above is arranged on one wall of the hollow waveguide 10.

The RF power coupling device 200 is used to generate RF power and couple it into the hollow waveguide 110. Different oscillation modes can be excited in the hollow waveguide 110 depending on the position and orientation of the device 200 on the wall of the hollow waveguide 110.

FIG. 3 shows a schematic representation of a waveguide arrangement 30 according to a third embodiment. The waveguide arrangement 30 comprises a coaxial waveguide 100. In the circumferential direction, the outer conductor 101 of the coaxial waveguide 100 has a plurality of openings 104, at each of which an RF power coupling device 200 is arranged. Each of these RF power coupling devices 200 is used to generate RF power and to couple this generated RF power into the coaxial waveguide 100.

Owing to the presence of a plurality of devices 200, overall a higher RF power can be generated and coupled into the waveguide 100. The risk of complete failure of the waveguide arrangement 30 is also reduced by the presence of a plurality of devices 200. Even if one or more RF power coupling devices 200 fail, RF power can continue to be coupled into the coaxial waveguide 100 with the remaining devices 200.

Figure 4:
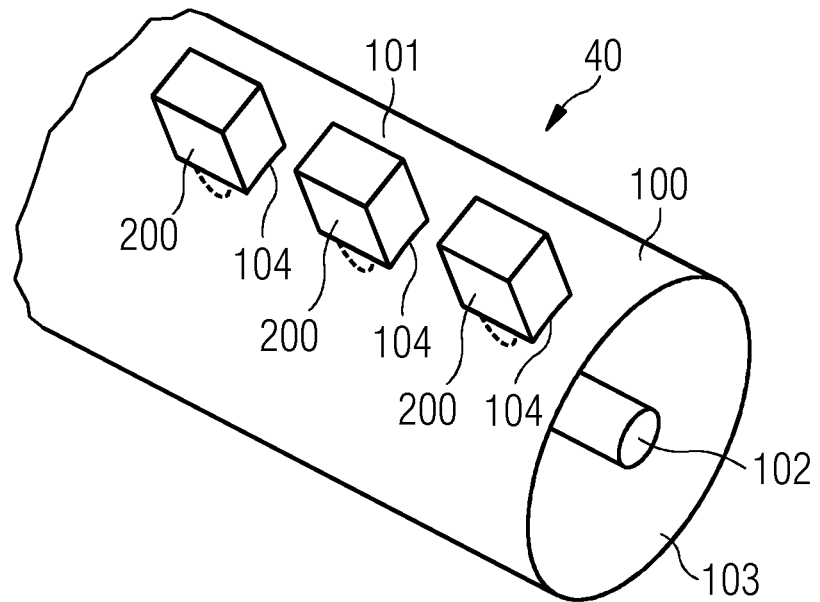
FIG. 4 shows another embodiment of a waveguide arrangement having a plurality of RF power coupling devices.

FIG. 4 shows a schematic representation of a waveguide arrangement 40 according to a fourth embodiment. The waveguide arrangement 40 comprises a coaxial waveguide 100. Along a longitudinal direction of the coaxial waveguide 100, the outer conductor 101 of the coaxial waveguide 100 has a multiplicity of openings 104. An RF power coupling device 200 is respectively arranged at each of these openings 104. Each of the devices 200 is again used to generate RF power and couple it into the coaxial waveguide 100.

The linear arrangement of a multiplicity of devices 200 also makes it possible to couple an overall higher RF power into the coaxial waveguide 100 than when there is only one RF power coupling device 200. Furthermore, the risk of complete failure of the waveguide arrangement 40 is again reduced by the presence of a plurality of devices 200.

Figure 5:
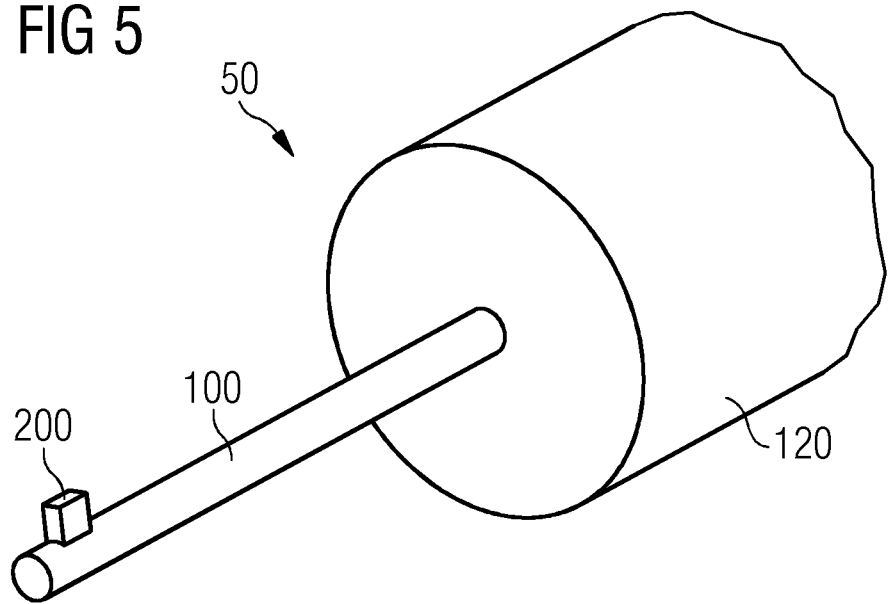
FIG. 5 shows an embodiment of a waveguide arrangement having a cavity.

FIG. 5 shows a perspective representation of a waveguide arrangement 50 according to a fifth embodiment. The waveguide arrangement 50 comprises a coaxial waveguide 100, which is connected to a device 200 for coupling RF power into the coaxial waveguide 100. The waveguide arrangement 50 furthermore has an RF cavity 120. The cavity 120 may also be referred to as a cavity resonator. The cavity 120 may, for example, be part of a particle accelerator and be used for accelerating electrically charged particles. The coaxial waveguide 100 of the waveguide arrangement 50 is connected to the cavity 120 in such a way that RF power coupled into the coaxial waveguide 100 by the device 200 can be transported through the coaxial waveguide 100 to the cavity 120 and fed into the cavity 120.

Although the invention has been illustrated and described in detail with reference to the preferred exemplary embodiment, the invention is not restricted by the examples disclosed. Other variants may be derived therefrom by the person skilled in the art without departing from the protective scope of the invention.

The invention claimed is:

1. A device for coupling RF power into a waveguide, comprising:
    a push-pull output stage having an input and an output;
    a filter arrangement that is connected to the output of the push-pull output stage; and
    an induction loop that is connected to the filter arrangement.

2. The device as claimed in claim 1, wherein the filter arrangement comprises a first harmonic filter and a second harmonic filter.

3. The device as claimed in claim 2, wherein the first harmonic filter provides a fixed finite impedance for a fundamental oscillation with a fixed frequency.

4. The device as claimed in claim 3, wherein the first harmonic filter acts as an open line termination for a third harmonic of the fixed frequency.

5. The device as claimed in claim 3, wherein the second harmonic filter acts as a short-circuited line termination for a second harmonic of the fixed frequency.

6. The device as claimed in claim 3, wherein the filter arrangement induces a reflection factor of at least 0.8 for a third harmonic of the fixed frequency.

7. The device as claimed in claim 3, wherein the filter arrangement induces a reflection factor of less than −0.8 for a second harmonic of the fixed frequency.

8. A waveguide arrangement having a waveguide and a device as claimed in claim 1.

9. The waveguide arrangement as claimed in claim 8, wherein the waveguide arrangement comprises two devices as claimed in claim 1.

10. The waveguide arrangement as claimed in claim 8, wherein the waveguide is a coaxial waveguide.

11. The waveguide arrangement as claimed in claim 8, wherein the waveguide is a hollow conductor.

12. The waveguide arrangement as claimed in claim 8, wherein the waveguide is connected to an RF cavity.

13. The device as claimed in claim 1, further comprising a coupling plate, wherein the induction loop is arranged on the coupling plate, further wherein the coupling plate is intended to be arranged in an opening of a wall of a waveguide.

* * * * *